US010534018B1

(12) United States Patent
Stein et al.

(10) Patent No.: US 10,534,018 B1
(45) Date of Patent: Jan. 14, 2020

(54) TIME BASE CORRECTION METHOD FOR HIGH ACCURACY SAMPLING SCOPE-BASED MEASUREMENTS

(71) Applicant: Guzik Technical Enterprises, Mountain View, CA (US)

(72) Inventors: Anatoli B. Stein, Altherton, CA (US); Alexander Taratorin, Palo Alto, CA (US); Valeriy Serebryanskiy, Santa Clara, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 16/249,234

(22) Filed: Jan. 16, 2019

(51) Int. Cl.
*G01D 18/00* (2006.01)
*G01D 21/00* (2006.01)
*G01P 21/00* (2006.01)
*G01R 35/00* (2006.01)
*G01R 13/02* (2006.01)
*H04B 10/079* (2013.01)

(52) U.S. Cl.
CPC ..... *G01R 13/0272* (2013.01); *H04B 10/0795* (2013.01)

(58) Field of Classification Search
CPC .................. G01R 13/0272; H04B 10/0795
USPC .......................................................... 702/89
See application file for complete search history.

(56) References Cited

U.S. PATENT DOCUMENTS 4,812,769 A  3/1989 Agoston
5,397,981 A  3/1995 Wiggers
(Continued)

FOREIGN PATENT DOCUMENTS

JP      04266279 A  *  9/1992
JP      406003372   *  6/1994

OTHER PUBLICATIONS

Wang et al., "Least-Squares Estimation of Time Base Distortion of Sampling Oscilloscopes" (IEEE Transactions on Instrumentation and Measurements, vol. 48, 6,1999).
(Continued)

*Primary Examiner* — Michael P Nghiem
(74) *Attorney, Agent, or Firm* — Burns & Levinson, LLP; Joseph M. Maraia (57) ABSTRACT

A method and apparatus for resolving time base-generated errors from sampling scope-based measurements. Mutually synchronized repetitive waveform-to-be-analyzed signals (WAS) and repetitive sinusoidal reference signals (RS) are respectively applied to a first channel and a second channel of a sampling scope. A time base generator applies a sampling signal to the first and second channels. An average sine wave period $T_{av}$ for k samples of RS is determined, followed by determination of phase error $\varphi_k$ for each of the k samples, corresponding to phase differences between an ideal sine wave signal and the applied reference sinusoidal signal. Time base error values $d_k$ for k samples are calculated from $d_k = \varphi_k * T_{av}/2\pi$. Error values $d_k$ correct time base errors in the sampling signal, and the WAS is re-sampled at sampling times adjusted by $d_k$.

11 Claims, 7 Drawing Sheets

(56) References Cited

U.S. PATENT DOCUMENTS 6,564,160 B2 5/2003 Jungerman et al.
2003/0208328 A1* 11/2003 Pickerd ............... G01R 13/029
702/67
2016/0363614 A1* 12/2016 Mochizuki ......... G01R 13/0272

OTHER PUBLICATIONS

Hale et al., "Compensation of Random and Systematic Timing Errors in Sampling Oscilloscopes"—IEEE Transactions on Instrumentation and Measurements, vol. 55, 6, 2006.
"Calibration Technique for Calibrating High Speed Equivalent Time Sampling Scope Using a Characterized High Speed Photo Diode", https://www.keysight.com/upload/cmc_upload/All/calibrationTecniqueForcalibratingHigh-BartSchriver.pdf, Publication date unknown.
Jargon et al., "Correcting Sampling Oscilloscope Time Base Errors With a Passively Mode-Locked Laser Phase Locked to a Microwave Oscillator" IEEE Transactions on Instrumentation and Measurement, vol. 59, 2010.
Vandersteen et al., "An Identification Technique for Data Acquisition Characterization in the Presence of Non-Linear Distortions and Time Base Distortions" (IEEE Transations on Instrumentation and Measurement, vol. 50, 2001).
Attivissimo et al., "Measuring Time Base Distortions in Analog-Memory sampling Digitizers", (IEEE Transactions on Instrumentation and Measurements, vol. 57, 2008).

* cited by examiner

TIME BASE CORRECTION METHOD FOR HIGH ACCURACY SAMPLING SCOPE-BASED MEASUREMENTS

TECHNICAL FIELD

The present disclosure relates to the correction of accuracy-degrading time base distortions which occur in sampling oscilloscope (or "scope")-based measurements, where the distortions are due to imperfections of time base generation circuitry in the scope.

BACKGROUND

Sampling scopes, or equivalent time, scopes are used for acquisition of repetitive high frequency signals. The advantages of sampling scopes, as compared to real-time digitizers, are based on the fact that signal samples are taken at a relatively low sampling rate and the signal is acquired during multiple signal repetitions, so that each signal sample is taken with a varied delay relative to a trigger signal. This "equivalent time" sampling method allows high dynamic range and bandwidth which are essential for high frequency measurements (e.g., for use in optical and communications applications). For example, modern sampling scopes offer 16-bit sampling analog-to-digital (ADC) resolution with up to 80 GHz bandwidth.

Time base sub-systems of sampling scopes determine a delay $\tau_k$ for a current signal sample $s_k(t)$ relative to a trigger signal. Different methods for time base generation are described in the prior art, see e.g. U.S. Pat. Nos. 5,397,981, 4,812,769 and 6,564,160. So-called "Precision Time Base" modules (e.g. Keysight model 86107A and others) are factory calibrated to provide high accuracy timing of samples. However, in most practical applications, time base accuracy obtained may be insufficient for needed precision measurements due to device changes after initial factory calibration, variations of ambient temperature and other factors.

The problem of time base accuracy has attracted considerable attention in prior art publications. For example, the paper "Least-Squares Estimation of Time Base Distortion of Sampling Oscilloscopes" by C. M. Wang, P. Hale and K. Coakley (IEEE Transactions on Instrumentation and Measurements, vol. 48, 6, 1999) and "Compensation of Random and Systematic Timing Errors in Sampling Oscilloscopes"—IEEE Transactions on Instrumentation and Measurements, vol. 55, 6, 2006 by P. Hale, C. Wang and others, describe methods for correction of time base errors based on multiple sine wave signals with different frequencies and phases, or using single frequency quadrature sine waves sampled simultaneously with a signal of interest. The latter method, developed by The National Institute of Standards and Technology (NIST), is used for "Electro-Optical Sampling" calibration of high frequency sampling scopes as described in "Calibration Technique For Calibrating High Speed Equivalent Time Sampling Scope Using A Characterized High Speed Photo Diode", B. Schriver, publication date unknown, web-published by Keysite Technologies Inc., Santa Rosa Calif., and "Correcting Sampling Oscilloscope Time Base Errors With A Passively Mode-Locked Laser Phase Locked to a Microwave Oscillator", J. Jargon, P. Hale and C. Wang, IEEE Transactions on Instrumentation and Measurement, vol. 59, 2010. However, the described methods have a number of disadvantages. They require a generation of high frequency quadrature signals, which is complicated. At least three sampling scope channels (two for calibration signals and one for an analyzed signal) are required for a calibration procedure. Moreover, time base calibration using laser diodes requires a sophisticated electro-optical setup and generally can only be done in a dedicated facility. Also, these calibration methods are based on a complicated numerical orthogonal distance regression method, which may not produce satisfactory results in all cases as indicated in the above-cited references.

A number of prior-art publications, such as "An Identification Technique For Data Acquisition Characterization In The Presence Of Non-Linear Distortions And Time Base Distortions" G. Vandersteen, Y. Rolain and J. Schoukens (IEEE Transations on Instrumentation and Measurement, vol. 50, 2001), "Measuring Time Base Distortions in Analog-Memory sampling Digitizers", F. Attivissiom et al (IEEE Transactions on Instrumentation and Measurements, vol. 57, 2008) describe different methods for time base error estimations based on multiple measurements using sine wave signals with different phases or multiple reference frequencies. Time base error is calculated from multiple sets of data using a maximum-likelihood estimator based on an iterative numerical procedure which may be affected by convergence and numerical instability problems.

It is, therefore, desirable to develop a simple and practical time base correction method which does not require a complicated hardware setup, multiple input signals and frequencies, multiple auxiliary sampling scope channels and complicated numerical algorithms having potential convergence and stability issues.

SUMMARY OF THE DISCLOSURE

A multi-channel sampling scope-based measurement method, and apparatus to perform the method, are disclosed for reducing time base-caused errors in measurements for at least one periodic waveform-to-be-analyzed signal characterized by a repetition period $T_w$, with respect to at least one reference sine wave signal characterized by a sampling period $T_s$, wherein the waveform-to-be-analyzed and the reference sine wave signal are synchronous with respect to a common periodic trigger signal characterized by the repetition period $T_w$.

In a form, pursuant to the method, or using the apparatus to perform the method, a waveform-to-be-analyzed signal and a reference sine wave signal are received and simultaneously processed, to generate at least one set of samples of the waveform-to-be-analyzed signal $V_k$ and at least one set of samples of the reference sine wave signal $S_k$, where k is an integer.

Then, an average sine wave period $T_{av}$ of the at least one reference sine wave signal is determined.

Following that determination of average, for each sample with a number k, a phase error $\varphi_k$ is determined, corresponding to a phase difference between an ideal sine wave signal and the received and processed reference sine wave signal.

Following that determination of phase error $\varphi_k$, for each sample with a number k, time base error values $d_k$ are calculated according to the equation $$d_k = \varphi_k \frac{T_{av}}{2\pi}.$$

Following that calculation of $d_k$, the at least one waveform-to-be-analyzed signal is re-sampled based on sampling time values adjusted by the time base error values $d_k$.

In a form, the at least one reference sine wave signal is characterized by a frequency, which is an integer multiple of repetition frequency of the waveform-to-be-analyzed.

In a form, the average sine wave period $T_{av}$ is determined by a zero-crossing detection-based method.

In a form, the re-sampling of the at least one waveform-to-be-analyzed signal is performed with a spline interpolation-based method.

In a form, the step of determining phase error $\varphi_k$, corresponding to phase differences between an ideal sine wave signal and the received and processed reference sine wave signal, for each signal sample with the number k, is performed by down-converting at least one received and processed reference sine wave signal and demodulating the phase error signal $\varphi_k$ corresponding to each signal sample with the number k.

In a form, the step of determining phase error $\varphi_k$, corresponding to phase differences between an ideal sine wave signal and the received and processed reference sine wave signal, for each signal sample with the number k, is performed by calculating a Hilbert transform of the at least one received and processed reference sine wave signal and calculating phase angle signal $\varphi_k$ corresponding to each signal sample k.

In a form, the step of determining phase error $\varphi_k$, corresponding to phase differences between an ideal sine wave signal and the received and processed reference sine wave signal, for each signal sample with the number k, includes sub-steps of determining amplitudes and phases of higher harmonics of the at least one reference sine wave signal and compensating phase errors, caused by the harmonics.

In a form, the sub-step of compensating phase errors caused by signal harmonics is performed by subtracting higher signal harmonics from the received and processed at least one reference sine wave signal, thereby obtaining at least one modified reference sine wave signal.

In a form, the step of determining phase error $\varphi_k$, corresponding to phase differences between an ideal sine wave signal and the received and processed reference sine wave signal for each signal sample with the number k, is performed by down-converting at least one modified reference sine wave signal and demodulating phase error signal $\varphi_k$ corresponding to each signal sample k.

In a form, the step of compensating phase errors caused by signal harmonics, includes the sub-step of generating at least one idealized sine wave signal, having amplitudes and phases of reference signal fundamental and higher harmonics.

In a form, the step of determining phase error $\varphi_k$, corresponding to phase differences between an ideal sine wave signal and the received and processed reference sine wave signal for each signal sample with the number k, includes a sub-step of calculating a Hilbert transform of the at least one received and processed reference sine wave signal and calculating phase angle difference $\varphi_k$ between the Hilbert Transform and instantaneous phase of the at least one received and processed reference sine wave signal corresponding to each signal sample k.

In addition, a multi-channel sampling scope-based measurement apparatus is disclosed for correction of time base-caused errors in measurements for at least one periodic waveform-to-be-analyzed signal characterized by a repetition period $T_w$. That apparatus generally comprises a sampling scope, a waveform-to-be-analyzed generator, a reference sine wave generator, a sampling clock generator, and a processor.

In a form, the sampling scope includes at least two sampling channels and a time base generator, adapted to sample input signals of the respective sampling channels, wherein the sampling is characterized by a sampling rate corresponding to the repetition rate of an applied periodic sampling signal.

In that form, the waveform-to-be-analyzed generator is adapted to generate and apply to an input of a first of the two sampling channels, at least one periodic waveform-to-be-analyzed signal characterized by a repetition period $T_w$.

In that form, the reference sine wave generator, adapted to generate and apply to an input of a second of the two sampling channels at least one reference sine wave signal characterized by a sampling period $T_s$. Preferably, the waveform-to-be-analyzed signal and the reference sine wave signal are synchronous with respect to a common periodic trigger signal characterized by the repetition period $T_w$, and the at least one reference sine wave is characterized by a frequency which is an integer multiple of the repetition frequency of the waveform-to-be-analyzed signal.

In that form, the sampling clock generator is adapted to generate and apply to the time base generator, the periodic sampling clock signal, wherein the period of the sampling clock signal is characterized by a repetition rate which is an integer-divided-down rate of the repetition rate of the reference sine wave signal, corresponding to the repetition rate of the waveform-to-be-analyzed signal so that a successions of samples of the waveform-to-be-analyzed signal and of the reference sine wave signal, are applied to the respective inputs of the first sampling channel and second sampling channel, are generated simultaneously.

In that form, a processor is adapted for processing the successions of samples to determine sampling scope-induced timing errors, and effect re-sampling of the applied waveform-to-be-analyzed signals with a sampling signal, including adjustments to compensate for the sampling scope induced timing errors.

DETAILED DESCRIPTION

Time base distortion varies over time and depends on a number of factors, such as a sampling rate of a signal-tobe-analyzed, acquisition time for such a signal, ambient temperature and others. In view of these factors, in accordance with a form of the invention, measurement system 10, illustrated in FIG. 1, a time base distortion measurement for a signal-to-be-analyzed is performed using a 2-channel sampling oscilloscope (or scope) 12. In an exemplary form, the 2-channel sampling scope 12 includes two sampling channels, sampling channel 1 (SC1), having an input CH1-IN and an output CH1-OUT, a sampling channel 2 (SC2), having an input CH2-IN and an output CH2-OUT, and a time base generator TBG, providing sampling signal TB to inputs of the respective sampling channels SC1 and SC2. The time base generator TB includes a trigger signal input TS-IN for receiving an applied trigger signal TS. In the illustrated form, a common reference clock characterized by a repetition period $T_w$, is applied both to a waveform-to-be-analyzed signal (WA) generator 14 and to a continuous wave signal (CW) generator 16. In response to the commonly applied reference clock, the WA generator 14 generates a relatively low frequency waveform-to-be-analyzed signal WAS also characterized by a repetition period $T_w$, and the CW generator 16 generates a high precision reference signal RS characterized by a sampling period $T_s$, for example, a stable single relatively high frequency sine wave. The common reference clock synchronizes WA generator 14 and CW generator 16, avoiding phase and frequency mismatch between generators 14 and 16. The waveform-to-be-analyzed signal WAS is applied to input CH1-IN of sampling channel SC1 of scope 12. The reference signal RS is applied to input CH2-IN of sampling channel SC2 of scope 12. The reference signal RS is also applied to an integer frequency divider 18, which generates a divided-down trigger signal TS, which is applied to the input TS-IN of the time base generator TB of scope 12. In this configuration it is important that the waveform-to-be-analyzed signal WAS and the reference signal RS are simultaneously sampled by the same sampling signal TB, produced by the time base generator.

Figure 1:
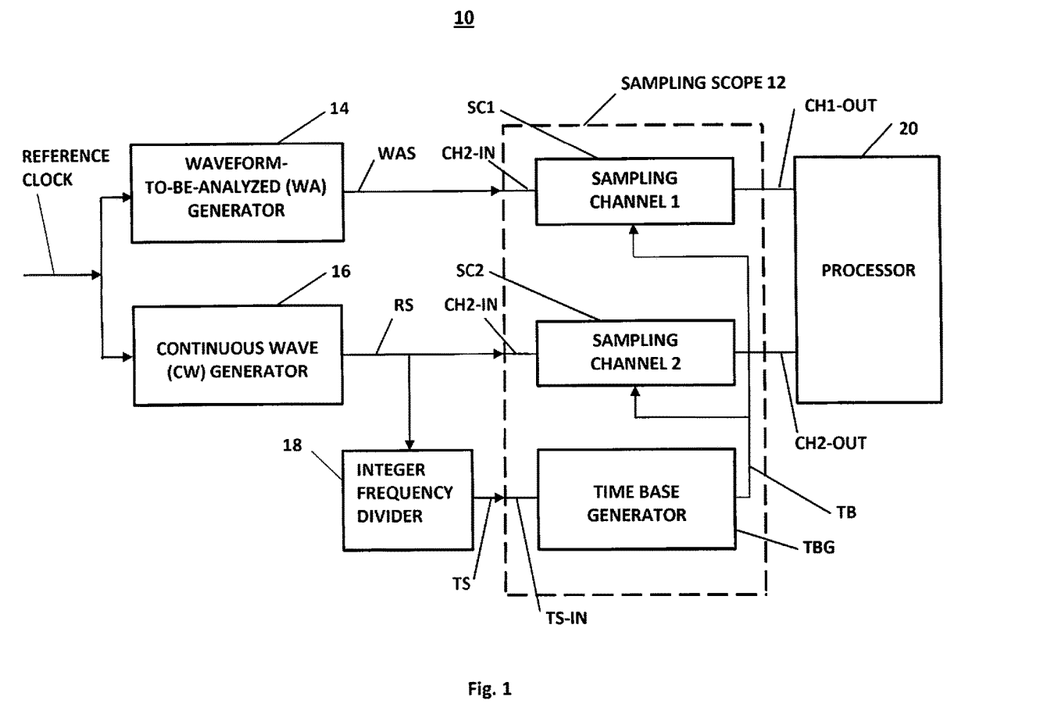
FIG. 1 shows a block diagram of an exemplary time base correction setup of the invention.

With this configuration, the waveform-to-be-analyzed signal WAS is sampled by sampling channel SC1 of scope 12 in response to the applied sampling signal TB, while reference signal RS is simultaneously sampled by sampling channel SC2 of scope 12 in response to the applied sampling signal TB.

In the illustrated form, a waveform-to-be-analyzed signal WAS is repetitive with the period Tw of the trigger signal TS, at a trigger frequency $f_{trigger}$, and the frequency $f_{ref}$ of the sine wave reference signal RS is proportional to the trigger frequency as $f_{ref}=N*f_{trigger}$, where N is integer. For various embodiments, the use of large values of N results in higher accuracy of time base reconstruction (e.g. a 10 GHz sine wave frequency for reference signal RS is a good choice for 10 MHz WAS signal repetition frequency). Again, for various embodiments, since $f_{ref}=N*f_{trigger}$, the trigger signal TS applied to TS-IN of scope 12 is conveniently obtained from the reference signal RS by using integer frequency divider 18.

Preferably, high accuracy acquisition by scope 12, is achieved using waveform averaging, which reduces sample noise and jitter. For the integer ratio of the reference frequency $f_{ref}$ of sine wave reference signal RS and the trigger frequency $f_{trigger}$ of trigger signal TS, averaging is preferably applied to both the waveform-to-be-analyzed sampling channel SC1 and the reference sampling channel SC2.

In summary, for the exemplary form illustrated in FIG. 1, the method of the invention includes the following important aspects. First, the waveform-to-be-analyzed waveform generator (WA) 14 and continuous wave (CW) generator 16 are driven by a common reference clock, thereby synchronizing the generated waveform-to-be-analyzed signal WAS and the sine wave reference signal RS while avoiding phase and frequency deviation. Importantly, the measurement method can be performed using a sampling scope 12 selected from generally available commercial scopes. A trigger signal TS for application to time base generator TBG of scope 12, is generated from CW generator 16 signal using integer frequency divider 18. The waveform-to-be-analyzed signal WAS is sampled by a first scope channel SC1, while the reference sine wave signal RS is simultaneously sampled by a second scope channel SC2. Both scope sampling channels, SC1 and SC2, have common a scope time base, provided by time base generator TBG of scope 12. Two simultaneously operating sampling channels with a common time base are readily available on currently available commercial sampling scope models. According to the preferred embodiment of the method of this disclosure, a reference sine wave signal is acquired synchronously with waveform of interest and samples of reference and analyzed waveforms are stored in scope memory. A time base errors correction processor 20 is coupled to CH1-OUT and CH2-OUT of scope 12. The processor 20 is preferably a computer system programmed to perform the computations necessary to determine the corrections to be made to the processed signals so that the errors are resolved.

With regard to a detailed description of the operation of the method, the k-th sample of a reference signal RS is represented by sine wave sample $S_k$ and the k-th sample of a waveform-to-be-analyzed WAS is represented by sample $V_k$, where $S_k$ and $V_k$ are given by the following expressions:

$$S_k=S(kT_s+d_k), \text{ and } V_k=V(kT_s+d_k),$$

where $T_s$ is the sampling period and $d_k$ is time base error for the k-th sample. In a more general case, each sample also has random time jitter, however it is here assumed that the reference sine wave and analyzed signal are captured with a sufficient number of averaging cycles, so that random jitter can be discarded from further consideration.

Once the sine wave reference signal is captured by scope 12, an ideal sine wave signal can be reconstructed with the knowledge of sine frequency, amplitude and phase. While the frequency of the external (to scope 12) sine wave generator 16 is known, it may deviate from the frequency of the captured (by scope 12) signal. This frequency deviation is caused by an internal reference oscillator of the scope 12, which is independent from external signal sources. Another source of possible frequency mismatch is caused by time base generator TB of the scope, causing time variations of captured signal frequency. Different methods can be used for resolving errors based on these factors, for example, methods based on frequency detector characteristics, Fourier or Hilbert transforms, well known in the prior art. For example, the magnitude of a Fourier transform generates a signal spectrum with a distinct spectral peak corresponding to an actual signal frequency. A Hilbert transform generates a complex signal with a real part equal to the captured waveform and imaginary part having a 90 degree phase shift. This allows calculation of an instantaneous signal frequency, and average signal frequency, of a captured signal. However, due to time base variations, the signal spectrum is distorted and average frequency estimates may not have sufficient accuracy. A frequency detector based on an average sine wave period $T_{av}$ is preferable.

A simple way for period calculation is based on a zero-crossing detector, where each signal sample is compared with zero level and a zero-crossing instant is found by linear interpolation between two adjacent samples. In order for accurate estimates of an average period, a large number of zero-crossings should be present in the signal and sufficient oversampling is required. For the measurement examples shown in FIGS. 2-7, the equivalent sampling frequency was 642.5 Gs/s, with sampling period 1.556 ps; a 10 GHz reference sine wave was used with a total acquisition length of 0.1 microseconds. This setup corresponds to 1000 sine wave periods with 64.25 samples per sine wave period and allows relatively accurate average period estimation. Another consideration for a sufficiently high frequency of the reference sine wave signal, comes from the time base error resolution—a higher reference sine wave frequency is more sensitive to time base errors than a relatively low frequency. In an experimental setup, the typical deviation of captured sine wave frequency from a 10 GHz reference signal was found to be 2.26005 MHz.

After a captured sine wave frequency $f_{ref}$ is determined, amplitude and phase of the sine wave signal are calculated by multiplying sine wave samples $S_k$ by complex exponential $E_k = e^{-i2\pi f_{ref} t_k}$ and averaging real and imaginary parts of the resulting signal values. This procedure corresponds to quadrature detection, well known in the prior art; an absolute value of the average complex number equals the signal amplitude, and the signal phase equals the angle between imaginary and real parts of the average complex number.

Figure 2:
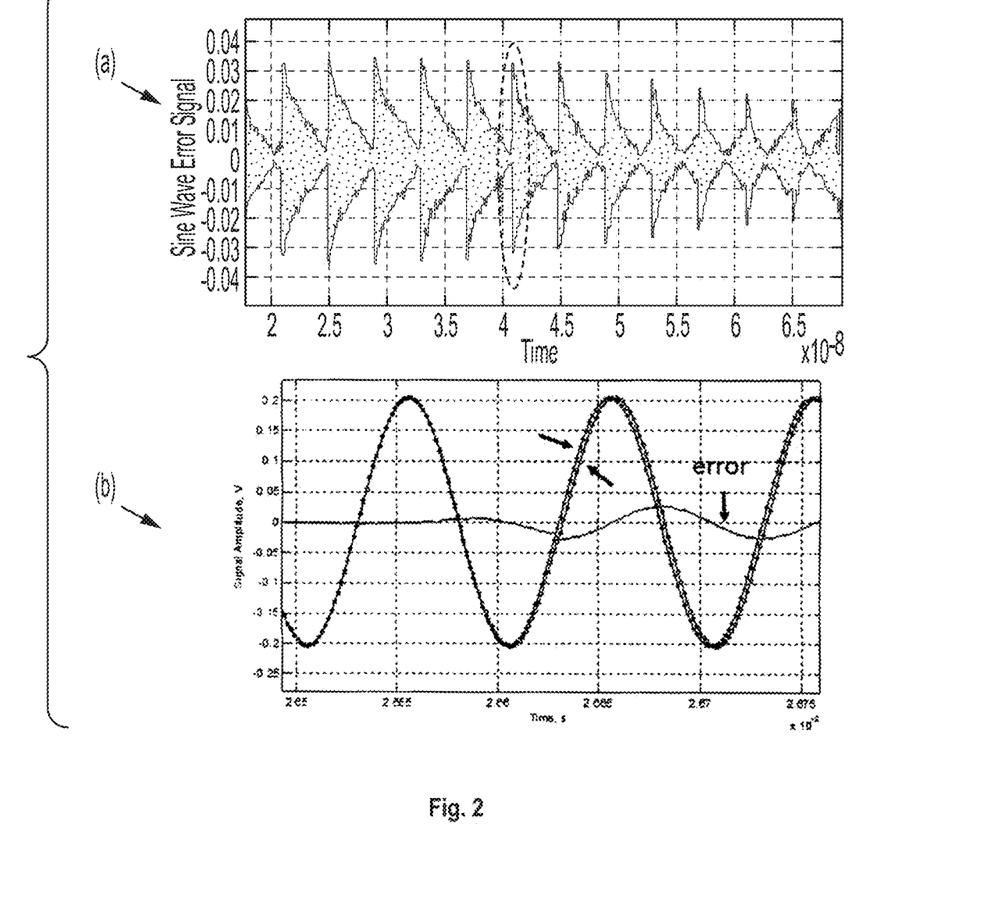
FIG. 2 shows in part (a), an example of an amplitude error signal caused by time base inaccuracy for an averaged acquisition of a 10 GHz sine wave signal with 642.5 Gsamples/s equivalent sampling, and in part (b), a zoomed-in 200 ps region corresponding to the deviation of a time base signal.

FIG. 2 shows a result of fitting a captured sine wave with an ideal sinusoidal signal shown on a whole 0.1 us acquisition length. The trace of FIG. 2a shows an amplitude error signal calculated as a difference between ideal and captured reference sine waves during a 50 ns time interval. As seen in part (a) of FIG. 2, the error signal is not periodic and exhibits multiple abrupt transitions. One of these transient regions is zoomed in part (b) of FIG. 2, showing ideal and captured sine wave signals and their difference (error) during a 0.25 ns time interval. As seen, initially (left side of the graph) the two signals coincide, and then the phase abruptly diverges as shown by arrows, and the error is increased. As can be seen from part (a) of FIG. 2, signal phase slowly drifts for the next several nanoseconds, and another phase transition occurs.

Figure 3:
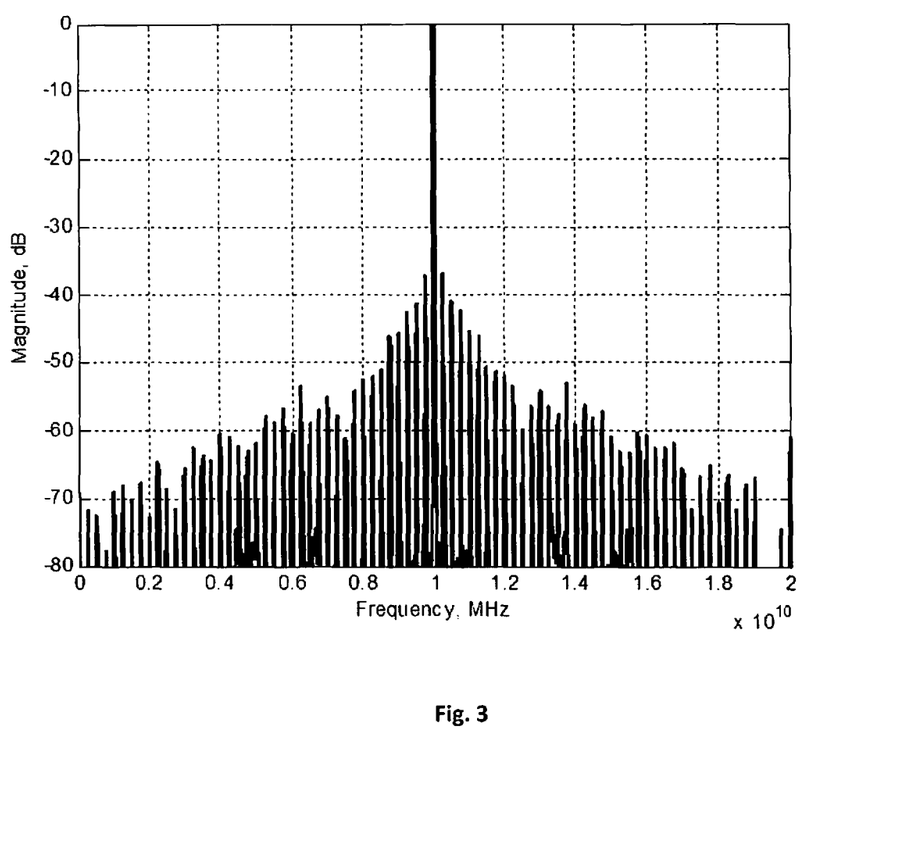
FIG. 3 shows a magnitude spectrum of a 10 GHz sine wave signal captured from a sampling scope without the time base correction of the invention.

FIG. 3 shows a spectrum of a captured sine wave signal. Variations of the time base are equivalent to phase modulation, so instead of a single spectral line at 10 GHz, a complicated side band structure is seen, with peak magnitude levels about −37 dBc.

The method for detection of time base error of this disclosure is based on a demodulation of error signal shown in FIG. 3. Several methods for phase error demodulation are possible and are described below in this disclosure.

Phase error signal is obtained using digital down-conversion, i.e., shifting a distorted sine wave signal spectrum to zero frequency by means of multiplying signal samples with values of a complex exponential $E_k = e^{-i2\pi f_{ref} t_k}$ and applying low-pass filtering to minimize noise impact and higher signal harmonics. By way of example, an appropriate low pass filter cutoff (e.g., 10 GHz) provides stable phase demodulation results. This down-conversion method results in a demodulated phase error signal $\varphi_k$ for each k-th signal sample.

Another method for phase error signal measurement is based on a Hilbert transform of the reference sine wave signal. As is well known in the prior art, a Hilbert transform can be performed in a spectral domain by using Fourier spectrum modification followed by an inverse Fourier transform, or by applying a Hilbert FIR (finite impulse response) filter to the captured reference signal samples. The output of a Hilbert transformed signal has real and imaginary parts, wherein the imaginary part phase is 90 degrees shifted relative to the phase of the real part. This method allows calculation of the instantaneous signal phase $\varphi_k$ corresponding to the phase error for each k-th signal sample.

Figure 4A:
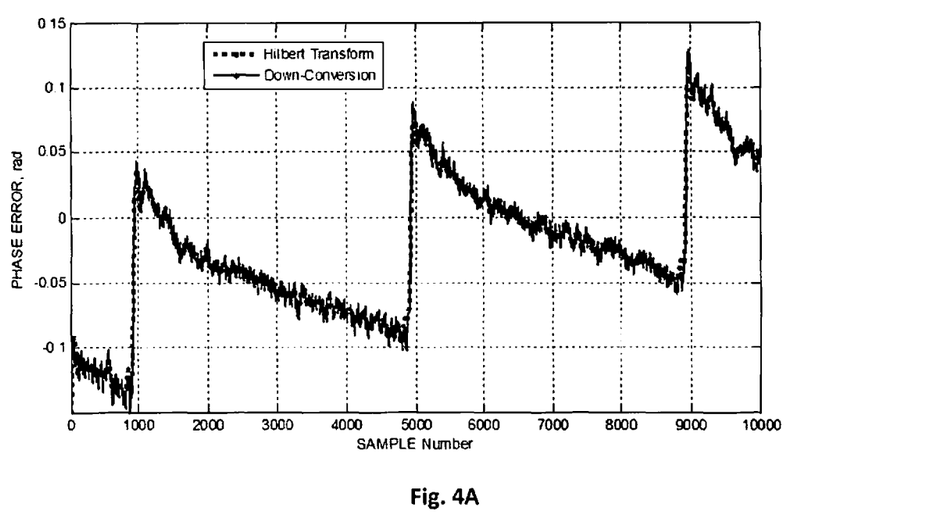
FIG. 4A shows a comparison of a phase error signal using down-conversion and Hilbert transform methods.

FIG. 4A shows a phase error signal obtained by down-conversion and a method of Hilbert filtering for a 10 GHz sine wave signal (first 10K scope samples are shown). As seen in that figure, both methods result in nearly identical phase error signal estimates. For each signal sample k, the phase of the low-pass filtered error signal $\varphi_k$ is converted to time using the following expression:

$$d_k = \varphi_k \frac{T_{av}}{2\pi}.$$

Figure 4B:
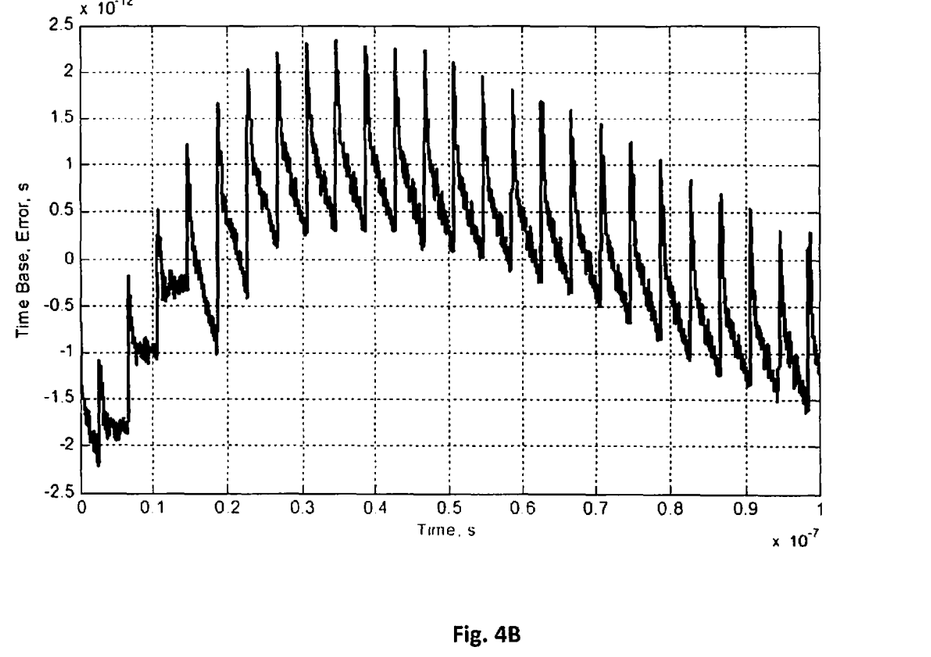
FIG. 4B shows a reconstructed time base error using the method of the invention for 0.1 microsecond acquisition period.

This conversion results in a time base error, shown in FIG. 4B. For an experimental acquisition used to illustrate the current disclosure, the time base error is non-periodic and shows both high frequency and low frequency variations with peak to peak values of 4.5 ps during a 0.1 us acquisition time.

Depending on the acquisition setup, the reference sine wave generator and the sampling scope hardware, a captured sine wave signal may be distorted by non-linearity and exhibit higher signal harmonics. The harmonic components result in phase error modulation and degrade time base error estimates. The digital down-conversion method for phase error detection may be combined with a low-pass filter cutoff frequency, eliminating the impact of the higher harmonics. A Hilbert transform for phase error signal measurement may also be used within an appropriate frequency bandwidth, eliminating the impact of the higher harmonics. If higher bandwidth measurements of phase errors are required, amplitudes and phases of higher reference sine wave harmonics can be measured using quadrature detection, and used for signal correction.

The digital down conversion method can be used when signal harmonics are compensated by subtracting corresponding harmonic signals from the captured reference waveform. This procedure eliminates harmonic spectrum peaks from the phase error calculation and improves measurement accuracy.

The instantaneous phase of a high bandwidth Hilbert transform includes phase modulation caused by harmonic components of the reference signal. This undesirable phase modulation is compensated by generating an idealized harmonic signal with amplitudes and phases of fundamental and harmonic components. The instantaneous phase of the idealized signal is subtracted from the phase of the Hilbert transform, thus providing compensation of harmonic phase distortions.

In order to correct time base distortions, the captured signal is re-sampled by calculating corrected sample values $VC_k = V(kT_s)$, corresponding to non-distorted uniform sampling. Complicated and computationally intensive methods based on signal reconstruction from non-uniform signal samples are known in prior art (for example, see H. Johansson and P. Lowenborg, "Reconstruction of Non-Uniformly Sampled Bandlimited Signal Using Time-Varying Discrete-Time FIR Filters", Proceedings of 12$^{th}$ European Signal Processing Conference, 2004). A much simpler approximate way of re-sampling is based on spline interpolation. This technique provides sufficient accuracy when the signal oversampling rate is high and adjacent sample displacements do not exceed several picoseconds for the range of practical signal bandwidths (e.g., 20-25 GHz).

Figure 5:
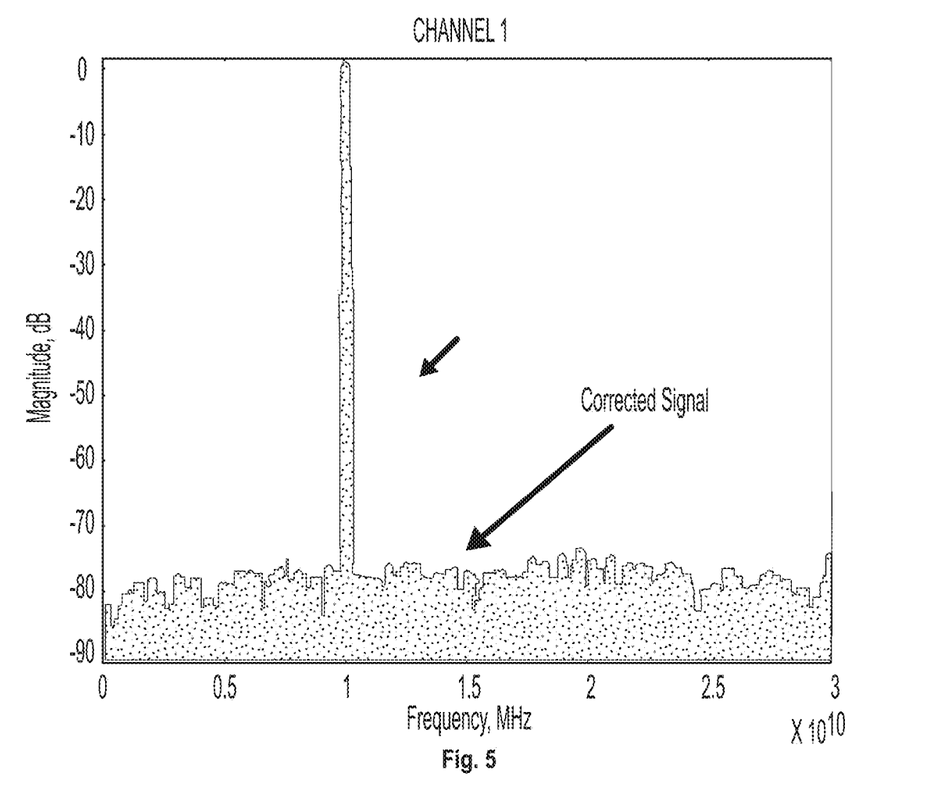
FIG. 5 depicts a magnitude spectrum for a 10 GHz sine wave signal before and after time base correction using the method of the invention.
Figure 6:
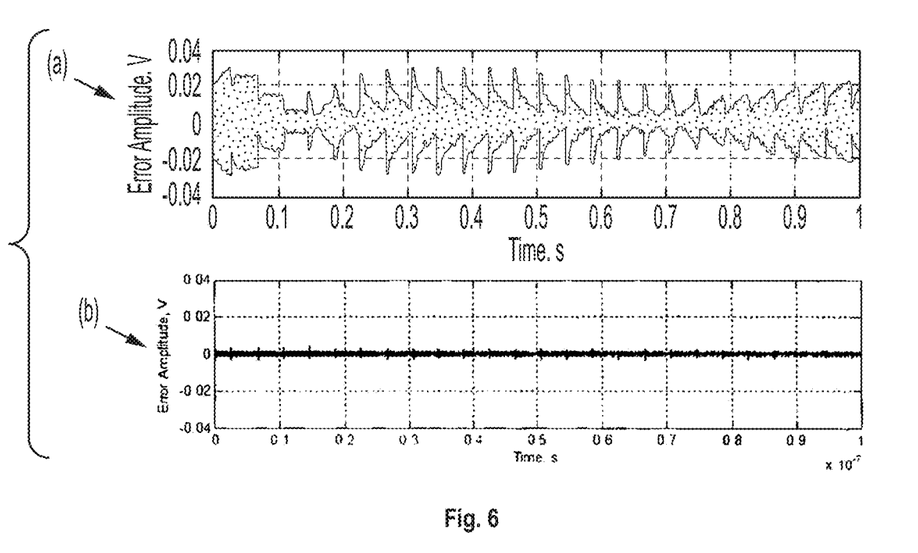
FIG. 6 shows an exemplary amplitude error in part (a) before, and in part (b) after, time base correction using the method of the invention.

Accuracy of time base reconstruction is visualized by comparing raw and corrected signal spectra (FIG. 5). As seen in that figure, the distortion spectrum caused by time base errors is reduced below −75 dBc within a 30 GHz bandwidth. A comparison of amplitude error before correction in part (a) of FIG. 6, and after correction in part (b) of FIG. 6, shows efficient reductions of error in the time domain.

The exemplary procedure of time base correction described in this disclosure was used for group delay measurements using a sampling scope and allows achievement of approximately 5 ps accuracy and repeatability, while without time base correction, group delay errors of over 150 ps have been observed.

Figure 7:
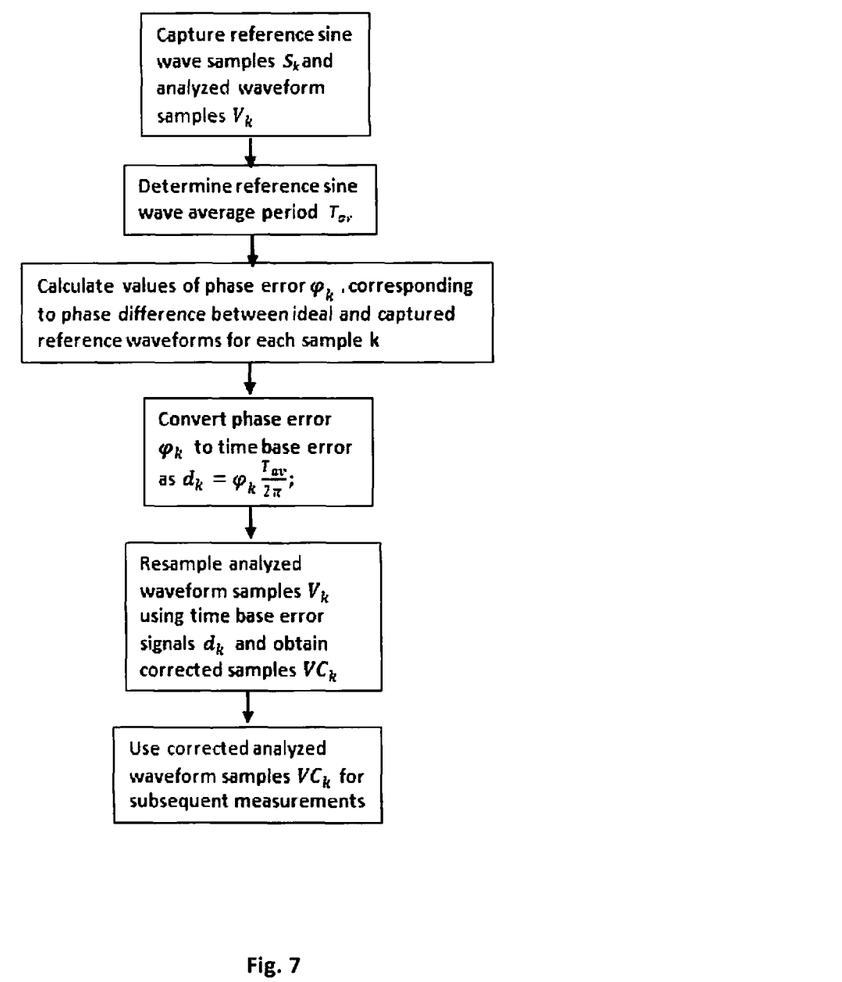
FIG. 7 is a flow chart showing the steps of a time base correction measurement using the method of the invention.

A flow chart shown in FIG. 7 summarizes a basic sequence of steps utilized for the time base correction method of the current disclosure.

Although the foregoing description of the embodiment of the present technology contains some details for purposes of clarity of understanding, the technology is not limited to the detail provided. There are many alternative ways of implementing the technology. For example, multiple sine wave signals having different phase and frequency may be acquired and processed to improve time base correction accuracy. Also, different types of phase detector can be implemented in practical measurements. As an example, one or several adjacent captured sine wave samples may be compared with adjacent ideal sine wave samples and local phase deviation can be calculated based on minimum deviation between two signals. Therefore, the disclosed embodiment is illustrative and not restrictive.

What is claimed is:

1. A measurement method for reducing time base-caused errors in measurements, comprising the steps of:
    by a multi-channel sampling scope including a first sampling channel, a second sampling channel, and a time base generator:
    A. receiving:
        i. at an input to the first sampling channel, at least one periodic waveform-to-be-analyzed signal characterized by a repetition period Tw and a trigger frequency $f_{trigger}$;
        ii. at an input to the second sampling channel, at least one reference sine wave signal characterized by a sampling period Ts and a frequency $f_{ref}$, wherein $f_{ref}=N*f_{trigger}$, where N is an integer greater than zero,
    wherein the waveform-to-be-analyzed signal and the reference sine wave signal are synchronous with respect to a common periodic reference clock signal characterized by the repetition period Tw, and
    simultaneously processing the received waveform-to-be-analyzed signal and the received reference sine wave signal including a sub-step of sampling the input signals of the respective first and second sampling channels, wherein the sampling is characterized by a sampling rate corresponding to the repetition rate of a periodic sampling applied by the time base generator, to generate at least one set of samples of the waveform-to-be-analyzed signal Vk and at least one set of samples of the reference sine wave signal Sk, where k is an integer; and
    by a digital signal processor:
    B. determining an average sine wave period $T_{av}$ of the at least one reference sine wave signal;
    C. for each sample with a number k, determining phase error $\varphi_k$, corresponding to a phase difference between an ideal sine wave signal and the received and processed reference sine wave signal;
    D. for each sample with a number k, calculating time base error values dk according to $dk=\varphi_k*T_{av}/2\pi$; and
    E. re-sampling the at least one waveform-to-be-analyzed signal based on sampling time values adjusted by the time base error values dk.

2. The method according to claim 1, wherein the at least one reference sine wave signal is characterized by a frequency which is an integer multiple of the repetition frequency of the waveform-to-be-analyzed signal.

3. The method according to claim 1, wherein the average sine wave period $T_{av}$ is determined by a zero-crossing detection-based method.

4. The method according to claim 1, wherein the re-sampling of the at least one waveform-to-be-analyzed signal is performed with a spline interpolation-based method.

5. The method according to claim 1, wherein the step of determining phase error $\varphi_k$, corresponding to phase differences between an ideal sine wave signal and the received and processed reference sine wave signal, for each signal sample with the number k, is performed by down-converting at least one received and processed reference sine wave signal and demodulating the phase error signal $\varphi_k$ corresponding to each signal sample with the number k.

6. The method according to claim 1, wherein the step of determining phase error $\varphi_k$, corresponding to phase differences between an ideal sine wave signal and the received and processed reference sine wave signal, for each signal sample with the number k, is performed by calculating a Hilbert transform of the at least one received and processed reference sine wave signal and calculating phase angle signal $\varphi_k$ corresponding to each signal sample k.

7. The method according to claim 1, wherein the step of determining phase error $\varphi_k$, corresponding to phase differences between an ideal sine wave signal and the received and processed reference sine wave signal, for each signal sample with the number k, includes sub-steps of determining amplitudes and phases of higher harmonics of the at least one reference sine wave signal and compensating phase errors, caused by the harmonics.

8. The method according to claim 7, wherein the sub-step of compensating phase errors caused by signal harmonics is performed by subtracting higher signal harmonics from the received and processed at least one reference sine wave signal, thereby obtaining at least one modified reference sine wave signal.

9. The method according to claim 8, wherein the step of determining phase error $\varphi_k$, corresponding to phase differences between an ideal sine wave signal and the received and processed reference sine wave signal for each signal sample with the number k, is performed by down-converting at least one modified reference sine wave signal and demodulating phase error signal $\varphi_k$ corresponding to each signal sample k.

10. The method according to claim 7, wherein the step of compensating phase errors caused by signal harmonics, includes the sub-step of generating at least one idealized sine wave signal, having amplitudes and phases of reference signal fundamental and higher harmonics.

11. The method according to claim 10, wherein the step of determining phase error $\varphi_k$, corresponding to phase differences between an ideal sine wave signal and the received and processed reference sine wave signal for each signal sample with the number k, includes a sub-step of calculating a Hilbert transform of the at least one received and processed reference sine wave signal and calculating phase angle difference $\varphi_k$ between the Hilbert Transform and instantaneous phase of the at least one received and processed reference sine wave signal corresponding to each signal sample k.

\* \* \* \* \*

UNITED STATES PATENT AND TRADEMARK OFFICE
CERTIFICATE OF CORRECTION

PATENT NO.       : 10,534,018 B1
APPLICATION NO.  : 16/249234
DATED            : January 14, 2020
INVENTOR(S)      : Anatoli B. Stein, Alexander Taratorin and Valeriy Serebryanskiy Page 1 of 1

It is certified that error appears in the above-identified patent and that said Letters Patent is hereby corrected as shown below:

In the Claims

Column 9, Line 51, (approx.) On Claim 1, A, ii, Line 4:
"$f_{ret} = N \ast f_{trigger}$"

Should read:
--$f_{ref} = N \ast f_{trigger}$--

Signed and Sealed this
Tenth Day of March, 2020

Andrei Iancu
*Director of the United States Patent and Trademark Office*